United States Patent [19]

Billings et al.

[11] Patent Number: 4,864,214
[45] Date of Patent: Sep. 5, 1989

[54] SOLID STATE POWER CONTROLLER

[75] Inventors: William W. Billings, American Township, Allen County; David A. Fox, Shawnee Township, Allen County, both of Ohio

[73] Assignee: Westinghouse Electric Corp., Pittsburgh, Pa.

[21] Appl. No.: 215,691

[22] Filed: Jul. 6, 1988

[51] Int. Cl.$^4$ .............................................. G05F 1/56
[52] U.S. Cl. ................................... 323/289; 323/284; 323/274; 307/300
[58] Field of Search .............. 323/274, 277, 282, 284, 323/285, 286, 289; 361/93, 98; 307/255, 270, 300, 280

[56] References Cited

U.S. PATENT DOCUMENTS

| | | | |
|---|---|---|---|
| 3,710,231 | 1/1973 | Baker | 323/290 |
| 3,753,078 | 8/1973 | Hedel | 323/277 |
| 3,898,552 | 8/1975 | Baker | 323/351 |
| 4,156,837 | 5/1979 | Baker | 323/289 |
| 4,321,485 | 3/1982 | Morozowich et al. | 307/300 |
| 4,404,473 | 9/1983 | Fox | 323/274 X |
| 4,453,089 | 6/1984 | Shuey et al. | 307/270 X |
| 4,491,744 | 1/1985 | Corey | 307/270 |
| 4,564,769 | 1/1986 | Melamed | 323/289 X |
| 4,569,011 | 2/1986 | Bailey | 307/270 X |
| 4,585,986 | 4/1986 | Dyer | 323/282 X |
| 4,588,904 | 5/1986 | Glogolja | 307/255 |

Primary Examiner—Patrick R. Salce
Assistant Examiner—Kristine Peckman
Attorney, Agent, or Firm—R. P. Lenart

[57] ABSTRACT

A solid state power controller is provided with an output circuit having a transistor which is connected between a pair of output terminals. Base current to the transistor is provided by a drive circuit which includes a pair of series connected diodes that provide biasing to offset the drive circuit and output transistor base voltage drops. Load current is sensed and a DC bias current is supplied to the diode pair, with the DC bias current being proportional to the load current. For bi-directional operation, a second output transistor is connected in series with the first output transistor and a pair of reverse series connected diode are connected in a circuit branch which parallels the two output transistors. Junction points between the output transistors and the reverse series connected diode circuit branch are connected together to provide for bidirectional load current flow.

7 Claims, 2 Drawing Sheets

SOLID STATE POWER CONTROLLER

BACKGROUND OF THE INVENTION

This invention relates to electric switching devices and, more particularly, to solid state power controllers for use in DC circuits.

Relatively high voltage DC power distribution systems are being developed for new aircraft and space electric power systems. These systems present challenging requirements for solid state power controllers that will be used for controlling and protecting loads and load buses beyond what is provided for by present state-of-the-art switchgear, either solid state or electromechanical. These power controllers must provide low power dissipation and low switch voltage drop and be capable of fast, accurate current limiting. For certain applications where the direction of current flow is subject to change at unpredictable times, bi-directional control of load and source current flow is required.

This invention seeks to provide efficient and reliable solid state power controllers having a low voltage drop and fast response time.

SUMMARY OF THE INVENTION

Solid state power controllers constructed in accordance with this invention include an output circuit stage having a first transistor connected between a pair of output terminals. The collector of the transistor is connected to one end of a series circuit of two diodes which form part of the transistor drive circuit. A bias current supply is connected to supply a DC bias current to the diode circuit branch and the drive also includes means for electrically connecting the other end of the diode circuit branch to the base of the transistor.

In an alternative embodiment of this invention, which is applicable to bi-directional power systems, the output circuit stage includes a second transistor connected in series with the first transistor and a second pair of diodes which are reverse series connected in a circuit branch that is connected in parallel with the two output transistors. A common connection point between the transistors is connected to a common connection point between the second pair of diodes.

In both of the above single polarity and bi-directional circuits, current in the output stage is sensed and the DC bias current may be adjusted to be proportional to the output stage current. This provides fast response time when current limiting operation is required.

DESCRIPTION OF THE PREFERRED EMBODIMENTS

Figure 1:
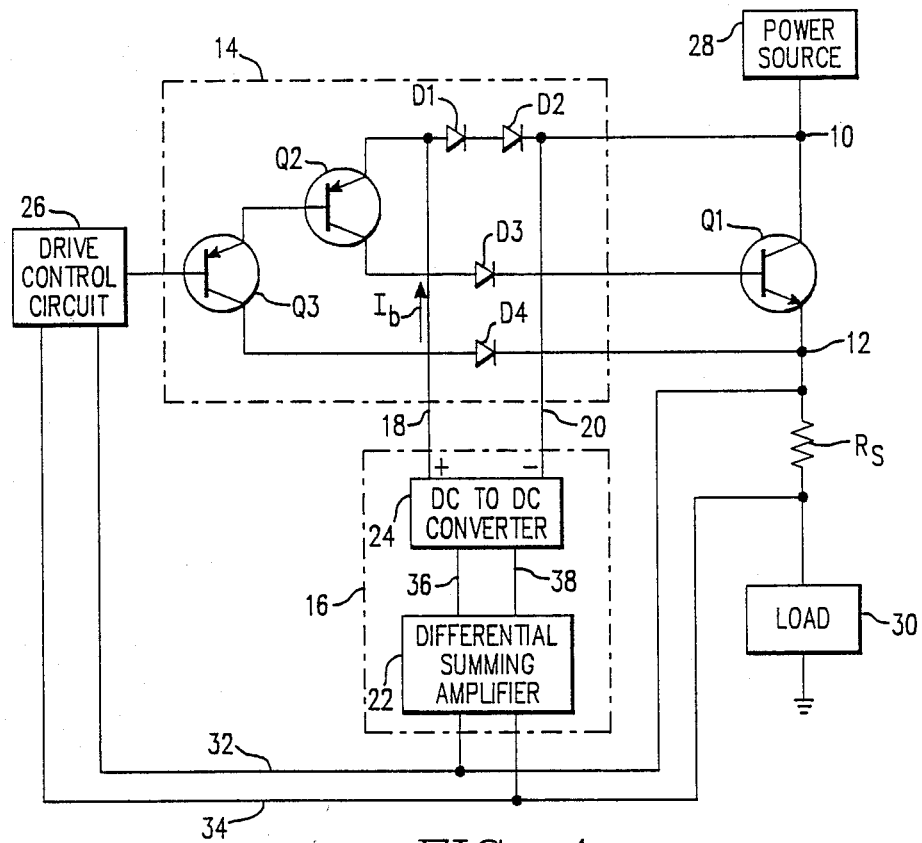
FIG. 1 is a schematic diagram of a solid state power controller constructed in accordance with one embodiment of the present invention.

Referring to the drawings, FIG. 1 is a schematic diagram of a solid state power controller, for use in a single polarity system, constructed in accordance with one embodiment of the present invention. The circuit comprises an output circuit stage including transistor Q1 having a base and a main conduction path between a collector and an emitter. The collector of transistor Q1 is connected to output terminal 10 while the emitter of transistor Q1 is connected to output terminal 12. A drive circuit 14 includes a pair of series connected diodes D1 and D2 in a circuit branch having a first end connected to the collector of transistor Q1. A bias current supply 16 provides DC bias current on conductors 18 and 20 to develop a drive circuit voltage across the series connection of diodes D1 and D2. The bias current supply 16 includes a differential summing amplifier 22 and a DC-to-DC converter 24.

Darlington-connected transistors Q2 and Q3 serve as means for switching the voltage across diodes D1 and D2 to the base of transistor Q1 through diode D3. Diode D4 serves as a steering diode to direct current from the collector of transistor Q3 to the emitter of Q1. A drive control circuit 26, which is constructed in accordance with known techniques and does not form part of the present invention, supplies a proportional drive signal to the base of transistor Q3 to initiate conduction of transistor Q1.

In operation, when transistor Q1 is on, current flows from an external DC power source 28 to an external load 30. A resistive shunt $R_s$, connected in series with the load, produces a signal on lines 32 and 34 which is proportional to current in the output stage of the power controller. This current signal is sent back to the drive control circuit and is also delivered to the differential summing amplifier which produces a DC voltage signal on lines 36 and 38. This DC voltage signal is proportional to the current in the output stage of the power controller. DC-to-DC converter 24, which may be constructed in accordance with known technology, converts the DC voltage signal on lines 36 and 38 to an appropriate level on lines 18 and 20 for proper circuit operation.

Output transistor Q1 is the power element that controls the connection or removal of the load to or from the power source. The drive circuit 14 is a power amplifier that interfaces the drive control circuit 26 and the output stage. It includes the series connection of diodes D1 and D2 which serve as an output voltage offsetting circuit that is provided with biasing current $I_b$ from the DC bias supply circuit 16. The DC bias current $I_b$ may be a fixed value or may be dependent upon the load current as discussed below. The bias supply circuit provides forward biasing current for diodes D1 and D2 which must be adequate to supply sufficient base drive current to transistor Q1.

One technique of providing base current is to determine the base current requirement at rated load and provide that amount of constant current whenever the output stage transistor is conducting. That approach has the disadvantage of causing unneeded losses in the drive circuit since for most applications load current will be lower than rated current. This invention uses an improved approach in that the supplied bias current is proportional to that required by the amount of load current flowing. To accomplish this, a simple, open loop control circuit is added to control the bias current supply. The differential summing amplifier 22 illustrated in FIG. 2, was designed to have an output voltage characteristic of $V_{out} = K1 + K2(I)$, wherein $V_{out}$ is the DC output voltage on lines 36 and 38, K1 and K2 are constants and I is the load current through resistive shunt $R_s$.

This operating characteristic provides an output voltage K1 independent of load current I to overcome bias circuit non-linearities and to provide a small bias current at no load, with a proportionally increasing bias current as load current increases. This technique can typically allow the drive circuit dissipation at no load to be about 10% of that at full load, considerably enhancing drive circuit efficiency.

Figure 2:
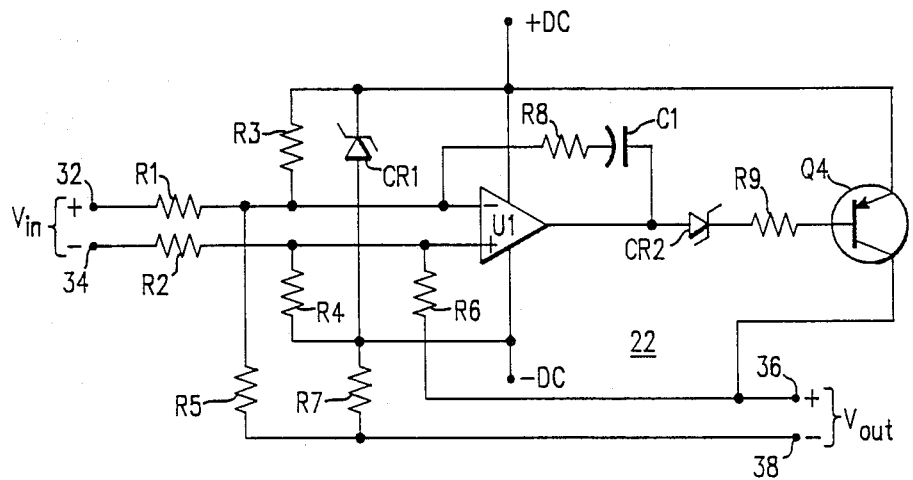
FIG. 2 is a schematic diagram of the differential summing amplifier of the circuit of FIG. 1.

In the circuit of FIG. 2, K1 is equal to the zener voltage of diode CR1 times the ratio of R3/R5. Similarly, the quantity K2(I) is equal to $V_{in}$(R5/R1).

By using the circuit of FIG. 2, it is possible to reduce circuit stresses, thereby improving reliability and lowering component failure rates. In addition, limiting the drive current further helps to limit fault currents and improve fault response times.

Figure 3:
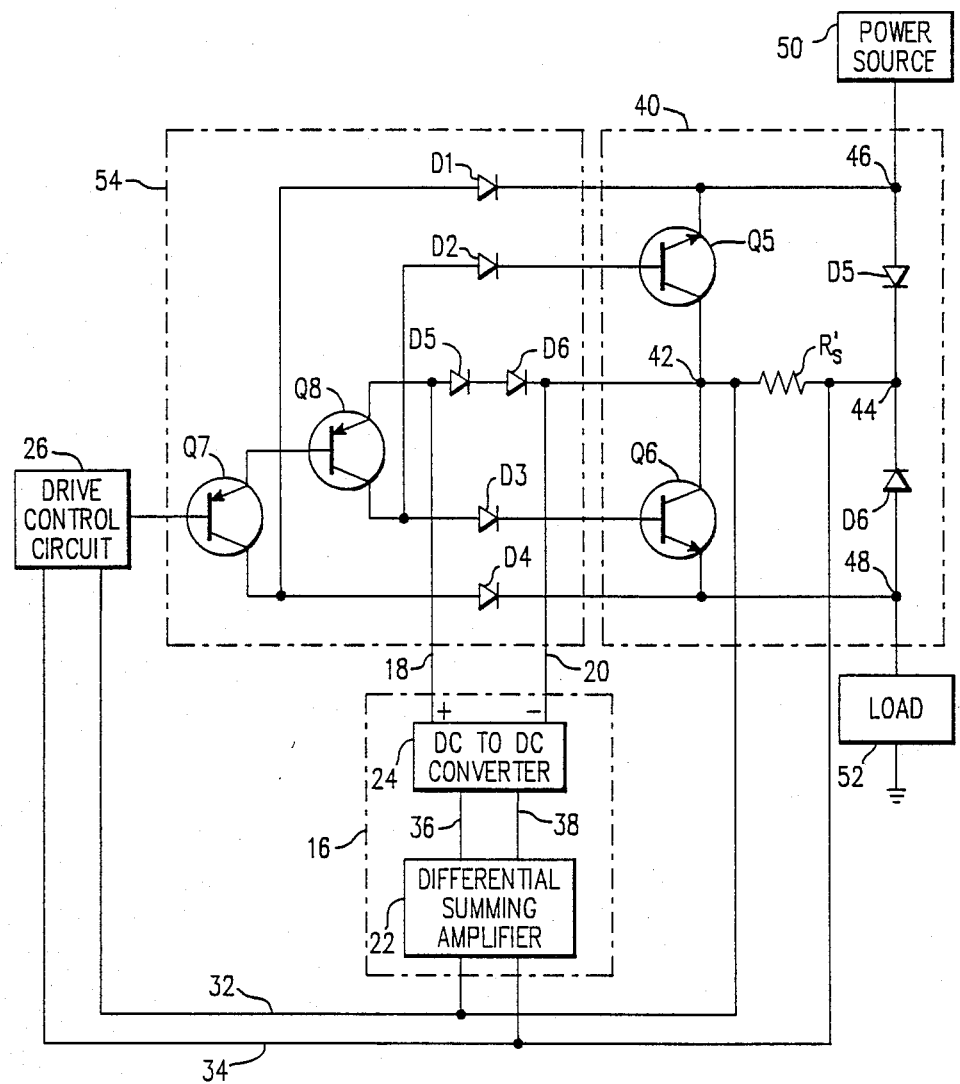
FIG. 3 is a schematic diagram of an alternative embodiment of the present invention.

FIG. 3 is a schematic diagram of a bi-directional power controller constructed in accordance with an alternative embodiment of this invention. In the power controller of FIG. 3, the output circuit stage 40 includes transistors Q5 and Q6 which are series connected in a first circuit branch including a junction point 42. A pair of reverse series connected diodes D5 and D6 are connected in a second circuit branch having a junction point 44. The first and second circuit branches are electrically connected in parallel with each other between output terminals 46 and 48 and the junction points of the first and second circuit branches are electrically connected together through resistive shunt $R'_s$. The output circuit stage 40 provides bi-directional current flow between items 50 and 52. In operation, items 50 and 52 may alternately act as sources or loads. For example, if item 50 is a battery it may act as a source to supply a dynamoelectric machine 52 operating as a motor. Alternatively, when the dynamoelectric machine 52 operates as a generator, it may be acting as a source to recharge the battery 50.

A drive circuit 54 includes Darlington-connected PNP power-transistors Q7 and Q8 which are shown as single devices, but may actually be a plurality of parallel connected transistors. Together, transistors Q5, Q6, Q7 and Q8 comprise a complimentary direct-coupled amplifier circuit. If current flows from terminal 46 to terminal 48, then transistors Q6, Q7 and Q8 will be conducting; likewise, if current flows from terminal 48 to terminal 46, then transistors Q5, Q7 and Q8 will conduct. Rectifiers D1, D2, D3 and D4 provide base current and steering current to whatever output transistor, Q5 or Q6, is carrying current as determined by the polarity of load current flow. The utilization of these four rectifiers avoids the use of two duplicate PNP drive circuits with associated complexity and performance degradation. Diodes D5 and D6 provide an increasesd operating potential for the drive circuit when operating in combination with the bias current supply circuit 16 as discussed with respect to FIG. 1. By strategically positioning the resistive shunt, a single polarity current indicating signal is developed, thereby permitting bias supply circuit 16 to function in both single and bi-directional embodiments of this invention. For a complimentary PNP-NPN transistor circuit, such as Q6 and Q8, the NPN (Q6) conduction voltage drop will be at least equal to the sum of the PNP (Q8) $V_{ce}$ and the NPN (Q6) $V_{be}$ voltage drops. This precludes transistor Q6 from operating in the low voltage drop, saturation mode. By adding the two biased rectifiers D5 and D6, between the Q6 collector and Q8 emitter, Q8 is biased about 1.5 volts DC above the collector of Q6, which is more than adequate to offset the undesired voltage components of the Q6 conduction voltage drop. Consequently, transistor Q6 can operate in the saturated conduction mode. With available NPN transistor current gains exceeding 10, the amount of power dissipation added by the bias rectifiers is significantly less than the power dissipation saved in transistor Q6 so that the net power reduction is about 1.5 watts per ampere of Q6 collector current. This is most significant since ratings of 100 amperes or more are being used for current designs. The drive circuit of FIG. 3 also has the advantage of helping limit the available base current for transistors Q5 and Q6 in the event of overloads and shorted loads so as to limit peak-fault current and improve response times.

Circuits rated 150 amps and 150–200 volts DC have been constructed in accordance with FIG. 3 and achieve switch voltage drops of less than 2 volts DC at 150 amperes. The efficient circuit design resulted in minimizing losses in the controller to about 15 watts at 1% load, increasing to 340 watts at 100% load. Short circuit let-through currents were limited to less than 200% peak overshoot and 50 microseconds duration, thereby limiting fault power flow.

By providing drive bias current which is proportional to load current, the power controllers of the present invention provide enhanced efficiency and reliability. In the bi-directional embodiment as illustrated by FIG. 3, power switch voltage drop was reduced by over 33%, when compared to previous bi-directional designs, by incorporating the offset biasing circuit in the drive stage. The use of a single drive circuit to drive both bi-directional output transistors results in circuit simplification, component reduction and more effective single point power stage control.

Although the present invention has been described in terms of what are at present believed to be its preferred embodiments, it will be apparent to those skilled in the art that various changes may be made without departing from the scope of the invention. It is therefore intended that the appended claims cover such changes.

What is claimed is:

1. A solid state power controller comprising:
    an output circuit stage including a first transistor, having a base and a first main conduction path between a collector and an emitter;
    means for electrically connecting said collector to a first output terminal;
    means for electrically connecting said emitter to a second output terminal;
    a drive circuit including a pair of diodes electrically connected in series with each other in a first circuit branch, a first end of said first circuit branch being electrically connected to said collector;
    a bias current supply connected to supply a DC bias current to said first circuit branch;
    said drive circuit further including means for electrically connecting a second end of said first circuit branch to said base of said first transistor;
    means for producing a current signal proportional to a load current flowing in said output circuit stage; and
    said bias current supply being responsive to said current signal such that said DC bias current is proportional to said current signal.

2. A power controller as recited in claim 1, wherein said DC bias current has a preselected minimum magnitude.

3. A power controller as recited in claim 1, wherein:
said means for producing a current signal proportional to a load current flowing in said output circuit stage comprises a resistive shunt electrically connected in series between said second output terminal and a load.

4. A power controller as recited in claim 1, wherein said bias current supply comprises:
a differential summing amplifier connected to receive said current signal;
said differential summing amplifier producing a DC voltage signal proportional to said current signal;
a DC to DC converter connected to receive said DC voltage signal; and
said DC to DC converter producing said DC bias current in said first circuit branch.

5. A bi-directional power controller comprising:
an output circuit stage including first and second transistors, each having a base and a main conduction path between a collector and an emitter, said main conduction paths being electrically connected in series with each other in a first circuit branch having a first junction point located between said transistors;
a first pair of diodes being reverse series connected in a second circuit branch having a second junction point located between said diodes;
said first and second circuit branches being electrically connected in parallel with each other between a pair of output terminals;
means for electrically connecting said first and second junction points together;
a drive circuit including a second pair of diodes electrically connected in series with each other in a third circuit branch, one end of said third circuit branch being electrically connected to said first junction point;
a bias current supply connected to supply a DC bias current to said third circuit branch;
said drive circuit further including means for connecting a second end of said third circuit branch to said bases of said first and second transistors;
means for producing a current signal proportional to current flowing in said output circuit stage; and
said bias current supply being responsive to said current signal such that said DC bias current is proportional to said current signal.

6. A bi-directional power controller as recited in claim 5, wherein:
said DC bias current has a preselected minimum magnitude.

7. A bi-directional power controller as recited in claim 5, wherein:
said bias current supply comprises a differential summing amplifier connected to receive said current signal;
said differential summing amplifier producing a DC voltage signal proportional to said current signal;
a DC to DC converter connected to receive said DC voltage signal; and
said DC to DC converter producing said DC bias current in said third circuit branch.

* * * * *